(12) United States Patent
Jeng et al.

(10) Patent No.: US 9,548,382 B2
(45) Date of Patent: Jan. 17, 2017

(54) SPINTRONIC DEVICE

(71) Applicants: Northeastern University, Boston, MA (US); National Sun Yat-sen University, Kaohsiung (TW); National Tsing Hua University, Hsinchu (TW)

(72) Inventors: Horng-Tay Jeng, Hsinchu (TW); Tay-Rong Chang, Taipei (TW); Arun Bansil, Dover, MA (US); Hsin Lin, West Lafayette, IN (US); Wei-Feng Tsai, Taipei (TW); Cheng-Yi Huang, Koahsiung (TW)

(73) Assignees: Northeastern University, Boston, MA (US); National Sun Yat-sen University, Kaohsiung (TW); National Tsing Hua University, Hsinchu (TW)

( * ) Notice: Subject to any disclaimer, the term of this patent is extended or adjusted under 35 U.S.C. 154(b) by 0 days.

(21) Appl. No.: 14/434,483

(22) PCT Filed: Oct. 11, 2013

(86) PCT No.: PCT/US2013/064628
§ 371 (c)(1),
(2) Date: Apr. 9, 2015

(87) PCT Pub. No.: WO2014/059328
PCT Pub. Date: Apr. 17, 2014

(65) Prior Publication Data
US 2015/0270376 A1   Sep. 24, 2015

Related U.S. Application Data

(60) Provisional application No. 61/712,870, filed on Oct. 12, 2012.

(51) Int. Cl.
*B82Y 10/00* (2011.01)
*B82Y 40/00* (2011.01)
(Continued)

(52) U.S. Cl.
CPC ......... *H01L 29/66984* (2013.01); *B82Y 10/00* (2013.01); *B82Y 40/00* (2013.01);
(Continued)

(58) Field of Classification Search
CPC ......... B82Y 10/00; B82Y 25/00; B82Y 40/00; G01J 4/04; G01R 33/00; G01R 33/06; G11C 11/16; H01F 1/402; H01F 1/404; H01F 1/405; H01F 10/005; H01F 10/16; H01F 10/193; H01F 10/3218; H01F 10/325; H01J 21/00; H01J 21/18; H01L 29/00; H01L 29/1054; H01L 29/1606; H01L 29/66; H01L 29/66431; H01L 29/66984; H01L 29/7613; H01L 29/7781; H01L 29/82; H01L 43/00; H01L 43/08; H01L 51/10; H01L 51/44
(Continued)

(56) References Cited

U.S. PATENT DOCUMENTS 5,280,181 A   1/1994  Saito et al.
6,355,953 B1  3/2002  Kirczenow
(Continued)

OTHER PUBLICATIONS

Chengyong Xu et al. Giant magnetoresistance in silicene nanoribbons. Nanoscale, 2012, v. 4, pp. 3111-3117.
(Continued)

*Primary Examiner* — John Poos
*Assistant Examiner* — David Mattison
(74) *Attorney, Agent, or Firm* — Hamilton, Brook, Smith & Reynolds, P.C.

(57) ABSTRACT

Provided in one embodiment is a device, comprising: a substrate; and a layer disposed over the substrate, wherein the layer comprises a monolayer of crystals comprising a Group IV element.

20 Claims, 11 Drawing Sheets

(51) Int. Cl.
  *H01L 43/08*  (2006.01)
  *H01L 29/66*  (2006.01)
  *H01L 29/76*  (2006.01)
  *H01L 29/16*  (2006.01)
  *H01L 29/778* (2006.01)

(52) U.S. Cl.
  CPC ...... *H01L 29/1606* (2013.01); *H01L 29/7613* (2013.01); *H01L 43/08* (2013.01); *H01L 29/66431* (2013.01); *H01L 29/7781* (2013.01)

(58) Field of Classification Search
  USPC ........................................................ 327/510
  See application file for complete search history.

(56) References Cited

U.S. PATENT DOCUMENTS

| | | | |
|---|---|---|---|
| 8,217,384 | B2 | 7/2012 | Finkelstein et al. |
| 2008/0012004 | A1 | 1/2008 | Huang et al. |
| 2008/0017843 | A1 | 1/2008 | Kaushal et al. |
| 2009/0141409 | A1 | 6/2009 | Santos et al. |
| 2009/0208672 | A1 | 8/2009 | Polanyi et al. |
| 2010/0109712 | A1 | 5/2010 | Zaliznyak et al. |
| 2010/0110744 | A1 | 5/2010 | El Baraji et al. |
| 2010/0123133 | A1 | 5/2010 | Wunderlich et al. |
| 2010/0224912 | A1 | 9/2010 | Singh et al. |
| 2011/0037512 | A1* | 2/2011 | Finkelstein ........... H01L 29/205 327/510 |
| 2012/0223294 | A1* | 9/2012 | Gohler ................... B82Y 10/00 257/40 |

OTHER PUBLICATIONS

International Search Report & Written Opinion on PCT/US2013/064628 dated Mar. 11, 2014.
Tsai, Wei-Feng et al. Gated silicene as a tunable source of nearly 100% spin-polarized electrons. Nature Communications 4, Article No. 1500.
YangYang Wang et al. Half-Metallic Silicene and Germanene Nanoribbons: Towards High-Performance Spintornics Devices. Nano Brief Reports, 2012, v. 7, pp. 1250037-1 to 1250037-9.
Zeyuan Ni, Qihang Liu, Kechao Tang, Jiaxin Zheng, Jing Zhou, Rui Qin, Zhengxiang Gao, Dapeng Yu, and Jing Lu. Tunable Bandgap in Silicene and Germanene. Nano Letters 2012 12 (1), 113-118.

* cited by examiner

SPINTRONIC DEVICE

RELATED APPLICATION

This application claims the benefit of and is a U.S. national application of International Application No. PCT/US2013/064628, entitled "Spintronic Device," filed Oct. 11, 2013, which claims the benefit of and priority to U.S. Provisional Application Ser. No. 61/712,870, filed Oct. 12, 2012, each of which are incorporated herein by reference in its entirety.

STATEMENT REGARDING FEDERALLY SPONSORED RESEARCH

This invention was made with government support under Grant Numbers DEFG02-07ER46352 and DE-AC02-05CH11231 awarded by the Department of Energy. The United States government has certain rights in this invention.

BACKGROUND

Controllable non-magnetic spintronic devices are desirable in the development of spintronics applications, which is an area of intense current interest. While the spin-polarization is generated by spin-orbit coupling ("SOC"), the entanglement between spin and orbital degrees of freedom due to the SOC may significantly reduce the degree of spin-polarization of spin-split states in most non-magnetic semiconductors including the topological insulators.

SUMMARY

In view of the foregoing, the Inventors have recognized and appreciated the advantages of systems comprising a high efficiency spintronics device comprising a monolayer of crystal material and methods of using and/or making same.

Accordingly, provided in one embodiment is a device, comprising: a substrate; and a layer disposed over the substrate, wherein the layer comprises at least one monolayer of crystals comprising a Group IV element or a III-V compound.

Provided in another embodiment is a spintronic device, comprising: a substrate; and a layer disposed over the substrate, wherein the layer comprises at least one monolayer of crystals comprising at least one of Si, Ge, Sn, and Pb or a III-V compound.

Provided in another embodiment is a method of using a spintronic device, comprising: subjecting the spintronic device to at least one of an external electric field and a magnetic field. The spintronic device may comprise: a substrate, and a layer disposed over the substrate, wherein the layer comprises at least one monolayer of crystals comprising a Group IV element or a III-V compound.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

The patent or application file contains at least one drawing executed in color. Copies of this patent or patent application publication with color drawings will be provided by the Office upon request and payment of the necessary fee.

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

DETAILED DESCRIPTION

Figure 1:
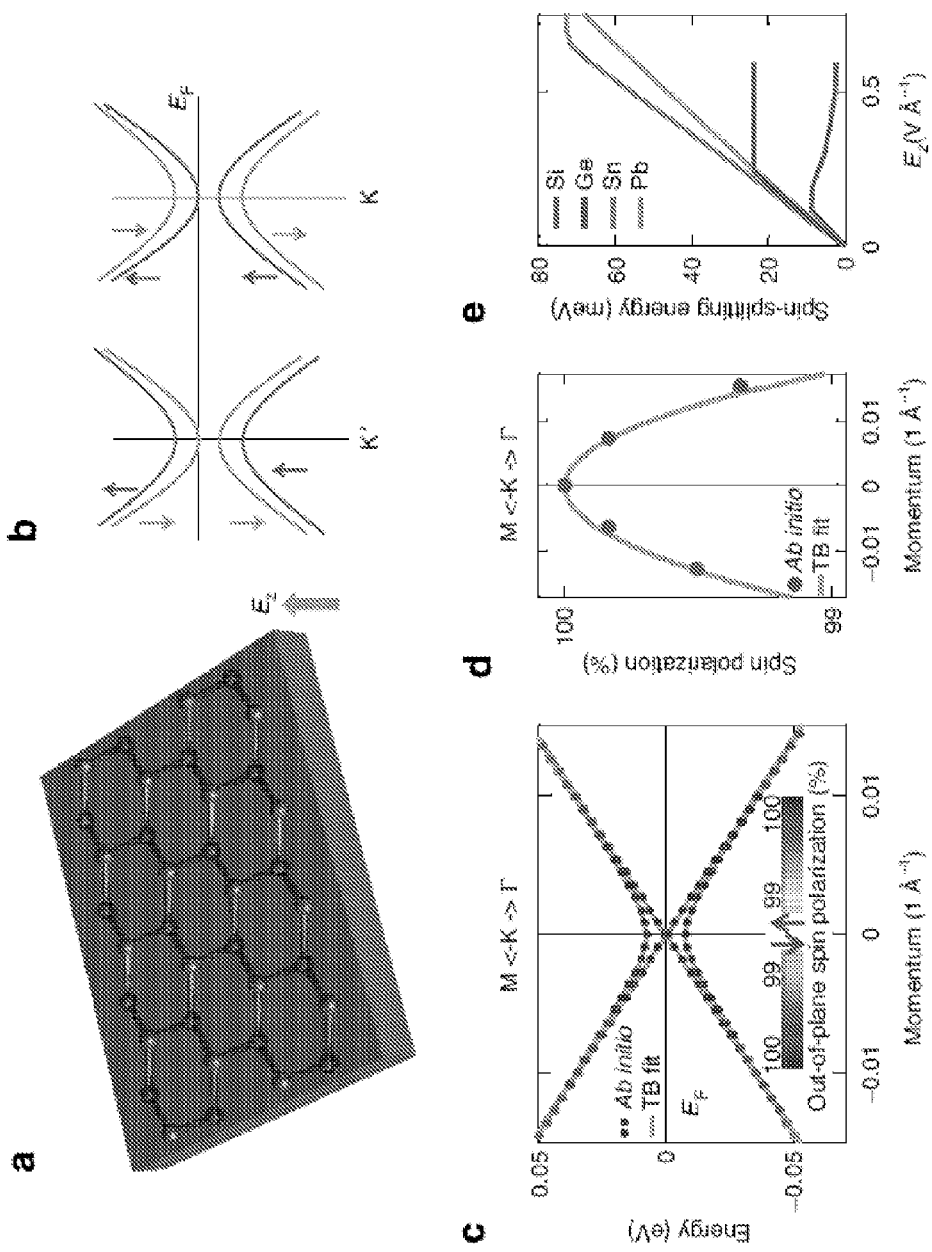
FIGS. 1($a$)-1($e$) illustrate the nearly fully spin-polarized states of silicene in one embodiment: (a) shows low-buckled 2D honeycomb structure of silicone; (b) shows a schematic of a spin-resolved band structure of silicene around K and K' points in the presence of an out-of-plane electric field, $E_z < E_c$: the red and blue arrows indicate the spin direction; (c) shows the band structure and (d) shows a spin-resolved wavefunction in the critical phase ($E_z = E_c$); and (e) shows the spin-splitting energy for silicene, and Ge, Sn, Pb counterparts as a function of $E_z$ obtained by first-principles calculations.

Following below are more detailed descriptions of various concepts related to, and embodiments of, inventive systems comprising a high efficiency spintronics device comprising a monolayer of crystal material and methods of using and making same. Provided in one exemplary embodiment is a gated silicene as a tunable source of nearly 100% spin-polarized electrons. It should be appreciated that various concepts introduced above and discussed in greater detail below may be implemented in any of numerous ways, as the disclosed concepts are not limited to any particular manner of implementation. Examples of specific implementations and applications are provided primarily for illustrative purposes.

Spintronic Device

Provided in one embodiment is a device, comprising: a substrate, and a layer disposed over the substrate, wherein the layer comprises at least one monolayer of crystals comprising a Group IV element or a III-V compound. The term "element" herein refers to the chemical represented by symbols that may be found on a Periodic Table. Group IV elements may include C, Si, Ge, Sn, Pb, and Fl. Group III elements may include B, Al, Ga, In, Ti, Uut. Group V elements may include N, P, As, Sb, Bi, and Uup. The III-V may comprise any combination of the Group III and Group V elements. When the monolayer of crystals comprise C, the monolayer of crystals may be referred to as "graphene." When the monolayer of crystals comprise Si, the monolayer of crystals may be referred to "silicene." The layer may comprise one monolayer but may also comprise multiple layers (e.g., multiple monolayers).

Silicene is a one-atom-thick two-dimensional crystal of silicon with a hexagonal lattice structure that is related to that of graphene but with atomic bonds that are buckled rather than flat. This buckling may confer advantages on silicene over graphene, because it may generate both a band gap and polarized spin-states that may be controlled with a perpendicular electric field. In one embodiment, the band structure of silicene is similar to that of graphene in that the conduction and valence edges occur at the corners (K and K' points) of the Brillouin zone (BZ). In one embodiment, silicene, however, differs from graphene at least with respect to the presence of a larger SOC, which opens gaps at the K-points. These gaps may be tuned with an external electrical field ("E-field") perpendicular to the plane, which breaks the inversion symmetry ("IS") of the system not to be bound any theory, but this may be due to the presence of buckling in the honeycomb structure. In one embodiment, the crystals have a lattice arrangement comprising broken inversion symmetry when subjected to an external electric field. Accordingly, silicene may overcome difficulties associated with graphene in electronics applications (lack of a controllable gap), potential applications of graphene in nano-electronics due to the available spin, valley and pseudo-spin degrees of freedom notwithstanding.

As an alternative, Ge, Sn, and Pb counterparts of silicene may have similar properties. In some instances, because these materials have a larger SOC, they have larger energy differences between the spin-split states making these materials better suited for room temperature applications. Thus, silicene, germanene, Sn and Pb thin films in several embodiments may be desirable candidates for functional electronics and spintronics applications. In one embodiment, silicene may be desirable over the other materials because it could be integrated more naturally into the existing Si-based technologies. However, in another embodiment, the other materials are more desirable than silicene, due in part to the benefits arising from having a larger SOC than silicene. In one embodiment, the material is selected because it has a larger SOC than graphene.

The substrate may comprise any suitable material, depending on the application. For example, the substrate may comprise at least one of an insulator and a semiconductor. An insulator may be any suitable insulator, depending on the application. The insulator may comprise an organic material, an inorganic material, or both. The semiconductor may be any suitable semiconductor, depending on the application. For example, the semiconductor may be an elemental semiconductor or a compound semiconductor. The semiconductor may comprise any of the elements in Groups III, VI, V, and VI. For example, the semiconductor may comprise IV, VI, III-V, II-VI, I-VII, IV-VI, V-VI, and II-V elements Applications The device described herein may be employed as a part of any suitable device, such as a spintronic device. A spintronic device may refer to any device that may be employed for any spintronic applications. For example, the spintronic device may be a spin filter, a spin separator, etc. In one embodiment, the monolayer of the spintronic device may comprise a quantum point contact (QPC).

In one embodiment, the device may be a spin filter. The spin filtering phenomenon may allow one to obtain highly spin-polarized charge carriers generated from nonmagnetic electrodes using magnetic tunnel barriers. The spin filter may be a silicene-based spin-filter that may enable the spin-polarization of an output current to be switched electrically, without switching external magnetic fields. It may be shown by first-principles calculations that field-gated silicene may possess two gapped Dirac cones exhibiting nearly 100% spin-polarization, situated at the corners of the Brillouin zone. In one instance, transport calculations indicate that the proposed designs will be highly efficient (nearly 100% spin-polarization) and robust against weak disorder and edge imperfections. The efficiency may be reflected in a spin polarization level that is nearly 100%. For example, the level may be at least about 60%—e.g., at least about 70%, about 75%, about 80%, about 85%, about 90%, about 95% about 99%, about 99.1%, about 99.2%, about 99.3%, about 99.4%, about 99.5%, about 99.6%, about 99.7%, about 99.8%, about 99.9%, about 99.95% about 99.99%, or higher.

In one embodiment, first-principles computations show that the band structure of one gated silicene described herein may have two nearly 100% spin-polarized Dirac cones at the K-points. Due at least in part to this feature, a silicene-based spin-filter, as well as a spin-separator (described below) may be designed and fabricated. In one embodiment, a silicene-based high-efficiency spin-filter (nearly 100% spin-polarization) may be suitable for high-frequency electronics applications. For example, the device may be designed to switch the output spin current simply by gating without the need to switch magnetic domains. The reflection and transmission of current at the junction of two domains may be analyzed with different external fields in order to obtain insight into transport selectivity between spin and valley degrees of freedom. In one instance, the high efficiency and tunability of the spin-filters described herein may take advantage of bulk charge carriers (rather than the edge current in quantum spin Hall (QSH) systems), thus making the silicene filter robust against weak disorder and edge imperfections.

In one embodiment, the device may be a spin separator. The spin separator may have any desirable geometry. In one embodiment, the spin separator provided herein may be a three-terminal spin/valley separator configured to generate spin-polarized currents with opposite spins at two output terminals of the three-terminal spin/valley separator. The three-terminal spin/valley separator may have, for example, a Y-shape. In one embodiment, the three terminal devices may be used for logical circuits beyond binary operations. One example of such non-binary operation may be, depending on the input signals at one terminal with the choice of OFF, ON (no spin), ON (up spin), ON (down spin) and the central region gate with the choice of OFF (no gate voltage), ON (positive gate voltage), ON (negative gate voltage), the output signals at the two output terminals can have various combination of OFF, ON (no spin), ON (up spin), ON (down spin) signals.

The various devices described herein may be employed in various applications, depending on the devices. In one embodiment, a method of using a device described herein may include subjecting the spintronic device to at least one of an external electric field and a magnetic (e.g., magnetic/exchange) field. In one embodiment, the device may be subjected to a magnetic field and the method may comprise switching electrically a spin-polarization of an output current from the spintronic device without switching the external magnetic field. In one embodiment wherein the device is a spin filter, the method may further comprise generating a spin-polarization level that is at least 99%. In one embodiment wherein the spintronic device is a Y-shaped three-terminal spin/valley separator, the method may further comprise: generating spin-polarized currents with opposite spins at two output terminals of the Y-shaped spin/valley separator.

The method of using the devices described herein may further comprise a method of fabricating the device. Depending on the device and the materials involved, any suitable fabricating techniques may be employed. For example, the fabrication may involve disposing the monolayer of crystals over the substrate. The disposition may involve any suitable technique, including spraying, physical deposition, chemical deposition, etc.

As a part of using and/or making the devices, computer simulations may be employed to aid the design of the devices. The computer simulation may be performed by any suitable processor (e.g., computer). The instruction to perform the simulation and thereafter the design may be stored in a non-transitory computer-readable medium.

NON-LIMITING WORKING EXAMPLES

Example 1

Methods

Performed in this Example were first-principles calculations based on the generalized gradient approximation using full-potential projected augmented wave method, as implemented in the VASP package. The 2D low-buckled honeycomb structures of Si, Ge, Sn and Pb were optimized using a 30×30×1 Monkhorst-Pack k-point mesh over the BZ with 350 eV cutoff energy. It was noted that the computed value of band gap of 8.4 meV in silicene is close to the value of 7.9 meV reported in the literature. The transport simulations are based on the iterative Green's function method, as further described in Example 2 below.

Results

Band Structure and Phase Transition Via IS Breaking

FIGS. 1(a)-1(e) show the low-buckled honeycomb lattice of silicene with its two sublattices A and B, and key features of the band structure. FIG. 1(a) shows the low-buckled 2D honeycomb structure of silicene. Due in part to the buckling, the IS may be removed by an external out-of-plane electric field $E_z$ or when the thin film is placed on a substrate. FIG. 1(b) shows a schematic of a spin-resolved band structure of silicene around K and K' points in the presence of an out-of-plane electric field, $E_z < E_c$: the red and blue arrows indicate the spin direction. The band structure in FIG. 1(c) and spin-resolved wavefunction in FIG. 1(d) in the critical phase ($E_z = E_c$) are illustrated: the tight-binding (TB) fit (green lines) is seen to reproduce the band dispersion and the nearly 100% electron intrinsic spin-polarization of states near the K-point obtained by first-principles calculations (red dots). FIG. 1(e) shows: the spin-splitting energy for silicene, and Ge, Sn, Pb counterparts as a function of Ez obtained by first-principles calculations.

At low energies, the π-electrons dictate the system and reside around two inequivalent valleys, K and K' points, in the first BZ. Although first-principles computations were performed, insight into the underlying physics was obtained by describing the system by a minimal, four-band tight-binding model.

$$H = -t \sum_{\langle i,j \rangle, \sigma} c_{i\sigma}^\dagger c_{j\sigma} + i \frac{\lambda_{SO}}{3\sqrt{3}} \sum_{\langle\langle i,j \rangle\rangle, \sigma\sigma'} v_{ij} c_{i\sigma}^\dagger s_{\sigma\sigma'}^z c_{j\sigma'} + \qquad (1)$$

$$i \frac{2\lambda_R}{3} \sum_{\langle\langle i,j \rangle\rangle, \sigma\sigma'} \mu_{ij} c_{i\sigma}^\dagger (s \times \hat{d}_{ij})_{\sigma\sigma'}^z c_{j\sigma'} +$$

$$\lambda_v \sum_{i,\sigma} \xi_i c_{i\sigma}^\dagger c_{i\sigma} + h \sum_{i,\sigma\sigma'} c_{i\sigma}^\dagger s_{\sigma\sigma'}^z c_{i\sigma'}.$$

where $c_{i\sigma}^\tau$ creates an electron at site i with spin-polarization σ. The first term is a nearest-neighbor hopping term on the honeycomb lattice. The second and third terms are intrinsic (IS preserved) and Rashba (IS preserved but z→−z mirror symmetry violated) spin-orbit interactions, respectively, which involve spin dependent next nearest-neighbor (NNN) hopping. s are the Pauli spin-matrices. $v_{ij} = \frac{1}{4}(d_i \_ d_j)z/|d_i \_ d_j|\frac{1}{4}\pm 1$ with two nearest-neighbor bonds, $d_i$ and $d_j$, connecting the NNN $d_{ij}$. $M_{ij} = 1(-1)$ when connecting A-A (B-B) sites. Notably, these SOCs, originating from buckling of the structure, are what distinguish silicene from graphene, even though both materials form a honeycomb lattice. The fourth term is an IS broken, staggered sublattice potential ($x_i=\pm 1$), which arises when an external out-of-plane electric field, $E_z$, is applied. The fifth term represents the effect of an applied out-of-plane Zeeman (exchange) field with strength h. The last two terms, corresponding to the microscopic responses to the external fields, turn out to be the driving forces for the phase transition discussed below.

Figure 5:
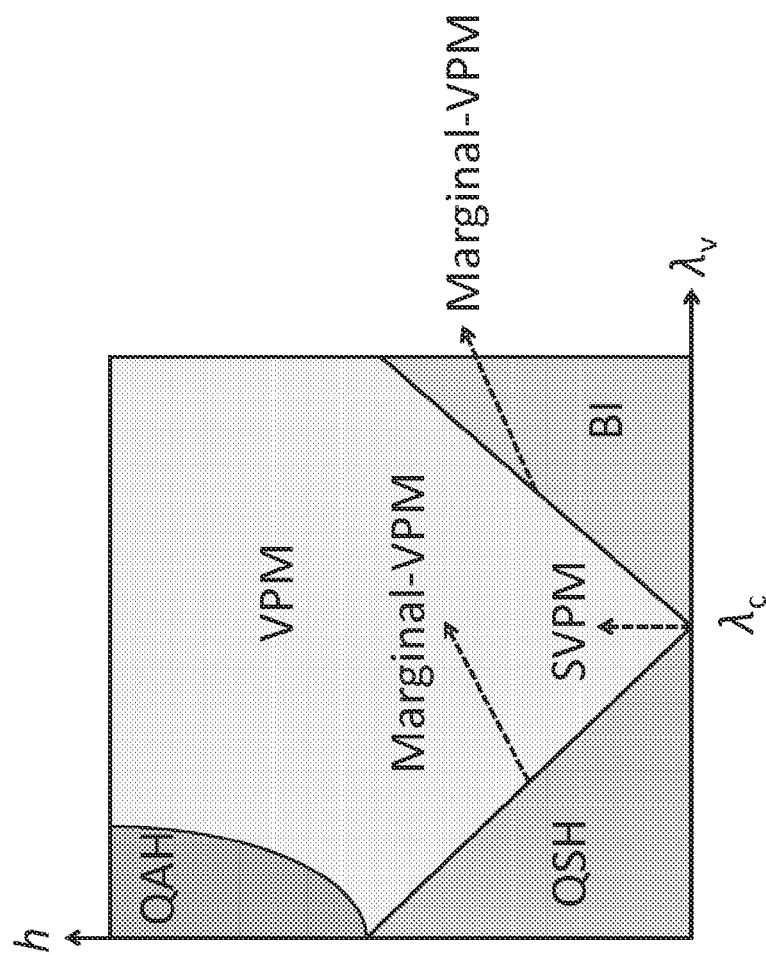
FIG. 5 illustrates a phase diagram in one embodiment.

A phase diagram is provided as in FIG. 5. All the coupling parameters (Table 1) have been obtained by fitting to first principles band structures of stand-alone silicene sheet and Ge, Sn, Pb counterparts. Note that the fourth term in the Hamiltonian of equation (1) refers to the net electrostatic potential difference due to the environment, and accounts for effects of both the external field and the presence of the substrate. Therefore, it is expected that the modeling result be relevant for silicene placed on a substrate so long as the coupling with the substrate is not so strong as to modify the electronic structure of the silicene sheet. Although the band gap could be enhanced through strong interaction with the substrate, which is desirable for room temperature applications, it may become a tradeoff between achieving a larger gap and the possible reduction in the degree of spin-polarization resulting from the involvement of substrate orbitals.

TABLE 1

Model parameters.

| | $\alpha$ (Å) | $\Delta_c$ (Å) | t (eV) | $\lambda_{SO}$ (meV) | $\lambda_R$ (meV) | l (eÅ) |
|---|---|---|---|---|---|---|
| Si | 3.87 | 0.44 | 1.04 | 4.2 | 8.66 | 0.035 |
| Ge | 4.06 | 0.68 | 0.97 | 11.8 | 2.81 | 0.046 |
| Sn | 4.67 | 0.84 | 0.76 | 36.0 | 18.76 | 0.055 |
| Pb | 4.93 | 0.89 | 0.72 | 207.3 | 0.06 | 0.143 |

Fitting results from first-principles calculations for stand-alone, two-dimensional Si, Ge, SN and Pb sheets. Relevent parameters are lattice constant ($\alpha$) with buckled structure, buckling distance ($\Delta_c$), transfer energy (t), spin-orbit coupling ($\lambda_{SO}$), Rashba spin-orbit coupling ($\lambda_R$), and the linear dependence of the applied electric field on $i_v$ ($I = \lambda_v/E_2$).

Figure 6:
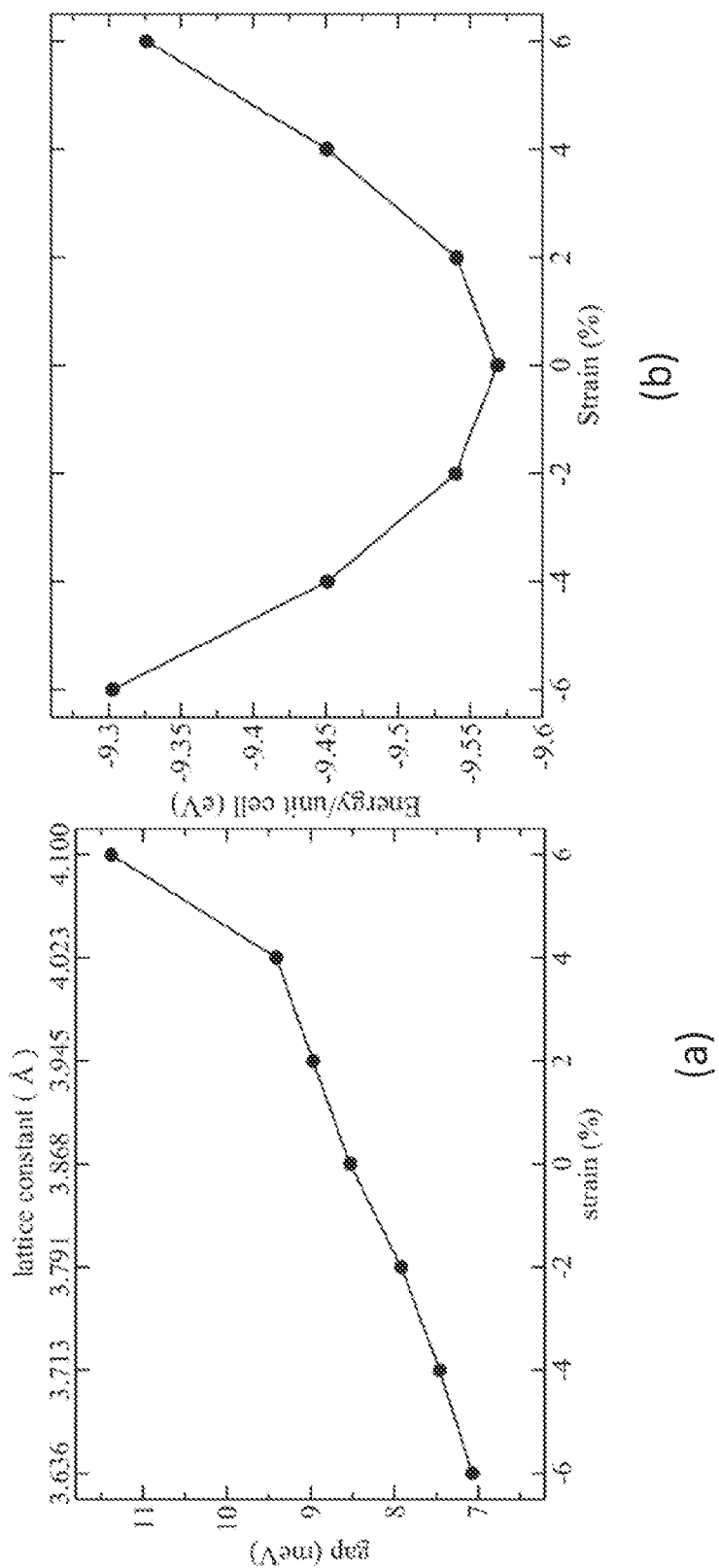
FIGS. 6($a$)-6($b$) illustrate the effect of strain in one embodiment: (a) shows band gap size as a function of strain; and (b) shows computed total energy as a function of strain for relaxed atomic positions.

The origin of the band gap itself could be different for different substrates. In order to help guide search for a suitable substrate, FIG. 6 illustrates the size of the band gap as a function of the lattice constant. It would perhaps be best to proceed by placing the silicene sheet on an insulator or semiconductor substrate where the lattice mismatch is not too great. It is noted the strong substrate coupling effects on a silicene sheet. Also, it is noted that if a non-magnetic metal with small spin-orbit coupling is used as contact material, the spin-up, as well as spin-down, states of silicene may couple with more or less equal strength with the substrate and as a result spin-transport will not be affected much even though contact resistance may be altered substantially.

In the absence of external fields, two of the four bands are occupied in Equation (1), so that the ground state of silicene is a QSH insulator with a SOC gap of $2\lambda_{SO}$=8.4 meV. The topological ($Z_2$) nature of this ground state may be easily examined by either the parity analysis or by showing the presence of helical edge states in a zigzag strip geometry. Note that the spin degrees of freedom in the band structure are still degenerate, as a consequence of both time reversal symmetry and IS, even though $s_z$ is no longer a good quantum number in the presence of NNN Rashba SOC (except at K-points where) $\lambda_R$ term makes no contribution).

When E is applied to the buckled structure in which the two atoms within the unit cell are not coplanar, a non-vanishing $\lambda_v$=1$E_z$ caused by IS breaking was obtained. The estimated value of I is given in Table 1. At K point, the energy gap, now $2|\lambda_{SO}-\lambda_v|$, decreases linearly as $E_z$ increases until a critical field $E_c$ is reached. More importantly, the spin degeneracy is lifted with energy splitting of $2\lambda_v$ as shown schematically in FIG. 1b and precisely in FIG. 1e. This splitting arises from the spatial IS breaking, as well as the presence of SOC in silicene. The spin-polarization profile around the K' point is opposite to that of the K point as required by time reversal symmetry. Furthermore, by symmetry arguments mentioned above, $s_z$ remains a good quantum number at K-points.

Approaching the critical field, $E_z-E_c$, the gap shrinks to zero, forming a Dirac-like cone near each valley with the spectrum, $\sqrt{k^2+m^2}$, where $m=\sqrt{\lambda_v^2+a^2\lambda_R^2k^2}$, and k denotes the momentum with respect to the K-point. See FIG. 1(c). In sharp contrast to the Dirac cone in graphene, where each cone is spin degenerate, the spin here is fully polarized along the z direction at each valley (see FIG. 1(d)) and develops a small in-plane component of the form, $\alpha(s \times k)^z$, with an of order $\lambda_R$. Therefore, in the critical phase (dubbed spin-valley-polarization metal (SVPM)[31]) near half-filling, the physics of the system is dominated by two nearly fully spin-polarized (with opposite polarizations) Dirac-like cones at K and K' points.

For $E_z>E_c$, the energy gap reopens at each valley and drives the QSH phase into the topologically trivial band insulating phase. It is noted that the spin-polarization is unchanged around K-point, although the probability amplitudes for A and B sublattices in the wavefunction are different. Starting from the band insulating phase with spin-polarization of each band similar to that shown in FIG. 1(b), a Zeeman field h along −z direction cannot affect the direct band gap at each valley. However, the conduction band bottom would shift downward at $K_0$ point, while the valence band top would shift upward at K point. Increasing h, therefore, reduces the indirect band gap of the system and drives it into a valley-imbalanced metallic state, dubbed valley-polarized metal (VPM), after crossing the zero indirect gap point.

Field-Tunable Spin Filter

As various phases in silicene may be realized through the interplay of applied electric and magnetic (e.g., magnetic/exchange) fields, it becomes possible to set-up a silicene-based device working as a high-efficiency spin-filter. This possibility is illustrated by considering a two-dimensional (2D) device consisting of a quantum point contact (QPC) in a silicene thin film. As seen in FIG. 2(a), a QPC is characterized by a short and narrow constriction. When a current I passes through the device by the application of an applied potential across the two wide regions, the conductance is sharply quantized in units of $e^2/h$. To make the valley degrees of freedom well separated and thus keep the features unique, the zigzag edges were chosen for the whole geometry along the direction of current flow. It was noted that a similar device has been proposed to realize a valley filter in graphene, but that works by using special properties of the edge state and it is different from this Example.

Through quantum transport calculations it is shown that on the first few conductance plateaus the QPC produces an almost fully spin-polarized current. By locally changing the potential barrier via gating control in the constriction, the spin-polarization direction may be easily reversed. To begin with, the tight binding description of silicene, equation (1), was mapped to the geometry shown in FIG. 2(a). The two opposite wide regions in the SVPM phase are arranged with Fermi energy $E_F$=0.07 t to model metallic source and drain ($E_F$=0 defines position of the 'Dirac point'). It was noted that in the source region both spin polarizations are present (see FIG. 2(c)). In the constriction, the system was kept in the marginal VPM phase with a fixed $E_z > E_c$ and the applied Zeeman field $h = \lambda_v - \lambda_{SO}$ such that the indirect gap becomes zero (see FIG. 2(d)). Furthermore, we added an electrostatic potential barrier U(x), which varies only along the current flow direction and is non-vanishing only in the constriction region, $$U(x_i) = U_0[\Theta_{L_s}(x_i) - \Theta_{L_s}(x_i - L)], \quad (2)$$

where L is the length of the narrow region, $L_s$ is a parameter for smoothing the potential, $\Theta_{L_s}(x_i) = 0(1)$ for $x_i < -L_s/2$ ($x_i > L_s/2$) and $\Theta_{L_a}(x_i) = \frac{1}{2} + \frac{1}{2}\sin(xx_i/L_s)$ for $|x_i| < L_s/2$ ($x_i = \frac{1}{2}$ defines the middle of the constriction). Two types of potential barriers were considered: (1) $L_s = 0$, a rectangular shape with potential height $U_0$ and (2) $0 < L_s < L$, a smooth shape, as shown in FIG. 2(a) (lower part) by solid and dashed curves, respectively.

A typical dispersion relation for the wide region in the SVPM phase is explicitly shown in FIG. 2(c). Given $E_F$, this region provides a total of 2N right-moving modes, in particular, as long as $E_F < (\lambda_v + \lambda_{SO})$ and $\lambda_R << \{\lambda_{SO}; t\}$, N propagating modes coming from the left valley will carry only down-spins and the other half modes coming from the right valley will carry only upspins. This result has the merit of conveniently counting the spin-polarization defined below, though, not necessary in the calculation presented herein. It was also noted that the two states closest to $k = \pi/\alpha$ have strong edge state character. On the other hand, for the constriction the dispersion relation is shown in FIG. 2(d). In the marginal VPM phase, each valley still has a direct gap but is shifted upward or downward due to the presence of h, resulting in a zero indirect gap. The two-terminal conductance of the QCP may be calculated by the Landauer formula $$G = \frac{e^2}{h} \sum_{\mu\nu} |t_{\mu\nu}|^2 = \frac{e^2}{h}(T_\uparrow + T_\downarrow), \quad (3)$$

where the spin-resolved transmission probability $$T_{\uparrow(\downarrow)} = \sum_{m \in t(1)} \sum_n |t_{mn}|^2$$

with m and n representing outgoing and incoming channels, respectively. The transmission matrix $t_{mn}$ may be computed numerically by the iterative Green's function method. The spin-polarization may now be expressed as $$P = \frac{T_\uparrow - T_\downarrow}{T_\uparrow + T_\downarrow}. \quad (4)$$

For $0 < P < 1$, the transmitted current is polarized with spin-up electrons, while for $-1 < P < 0$, the polarization is reversed.

Figure 7:
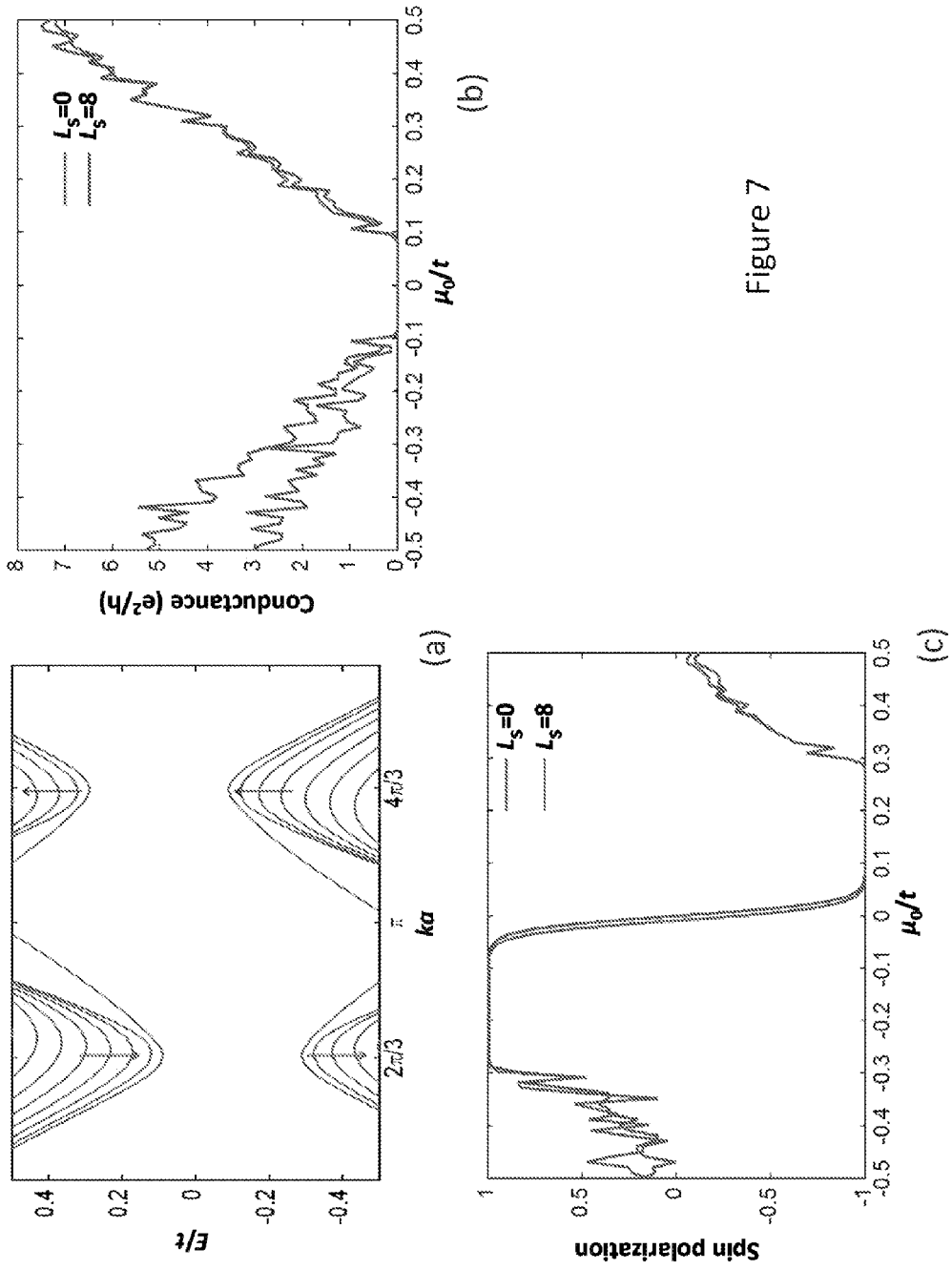
FIGS. 7($a$)-7($c$) illustrate spin filter with the constriction in the band insulating phase in one embodiment: (a) shows the band dispersion of the constriction with $\lambda_v = 0.7t$, $h = 0.1t$ in BI; and (b) and (c) show conductance and spin polarization, respectively, for the spin filter as a function of $\mu_0$.
Figure 8:
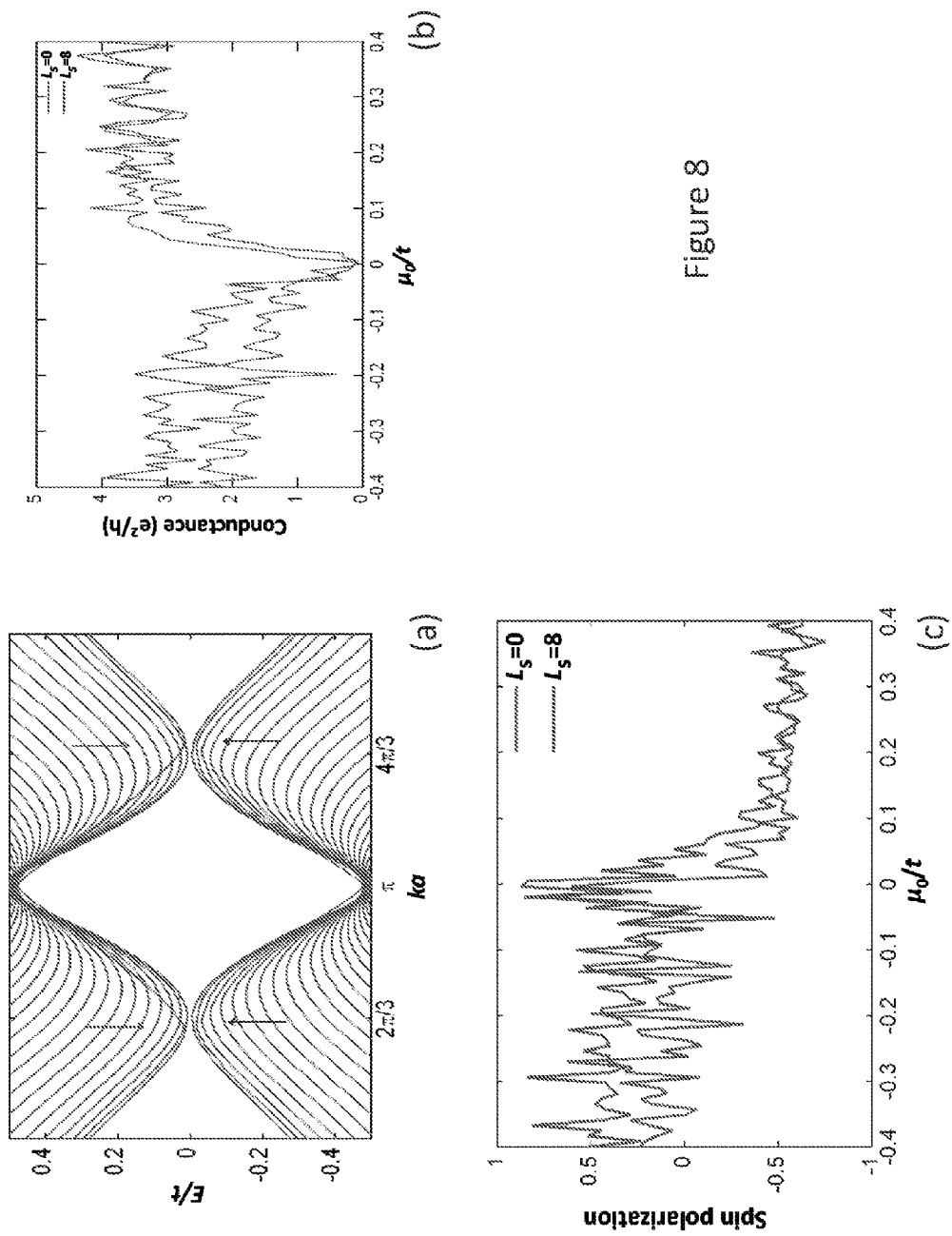
FIGS. 8($a$)-8($c$) illustrate spin filter with the constriction near a critical state in one embodiment: (a) shows the band dispersion of the constriction with $\lambda_v = 0$, $h = 0.52t$; and (b) and (c) show conductance and spin polarization, respectively, for the spin filter as a function of $\mu_0$.

For a specific demonstration, a geometry with the length of the constriction $L_z = 86a$, the width of the wide region $L_y = 70\sqrt{3}a$, $L = 34a$, and the width of the constriction $W = 40\sqrt{3}a$ was considered; realistic parameters given in Table 1 were adopted for silicene and $\lambda_v = E_c l$ was taken for the wide regions to be in the SVPM phase, and $\lambda_v = 0.053 t$ ($> \lambda_{SO}$) and $h = 0.05 t$ for the gated constriction to be in the marginal VPM phase. $E_F = 0.07 t$, was set, resulting in 2N=10 right-moving modes. The resulting spin-polarization as a function of the effective chemical potential, $\mu_o \_ E_F \_ U_o$, is shown in FIG. 2(b). Clearly, for positive $\mu_o < 2h \approx 0.1$ eV, the current flows entirely within the conduction band of the left valley and the polarization reaches almost 100% efficiency with downspin. Conversely, for negative $\mu_o < -2h$, the current flows within the valence band of the right valley and nearly 100% spin-polarization is now achieved with up-spin. The case discussed here is the most optimal one. It is possible to use different $E_z$ and h values in the constriction, which may turn silicene into other phases, but we find that the spinfilter still remains functional. See FIGS. 7-9.

Transport Properties

Figure 3:
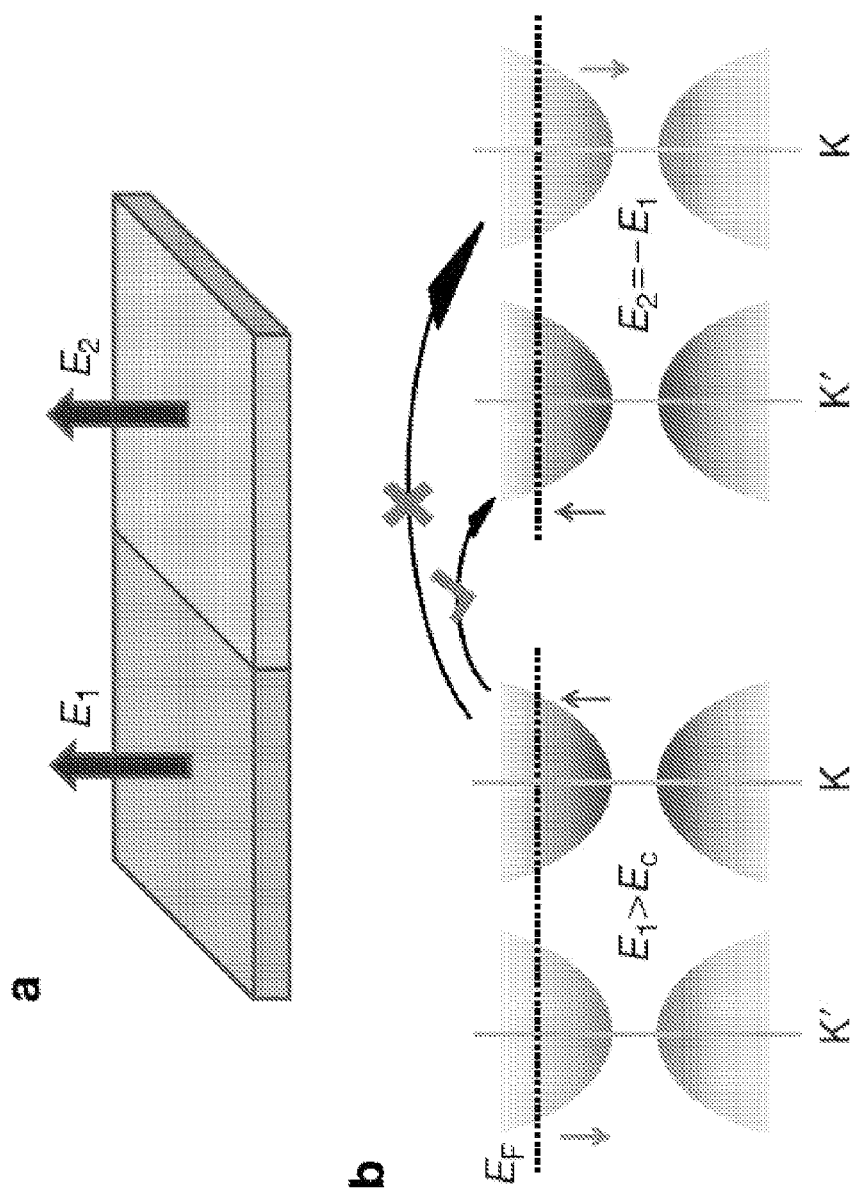
FIGS. 3($a$)-3($b$) illustrate transport selectivity due to spin and valley degrees of freedom in one embodiment: (a) shows transport between two separated regions (by applying different electric fields) of a silicene strip; and (b) shows a schematic illustration for robust spin-preserved (instead of valley-preserved) scattering processes.

In order to extract which transport features are important ingredients for the high-efficiency spin-polarization in the device, a simple transport arrangement that bisects a long strip of silicene (with zigzag edges) into two halves as shown in FIG. 3(a) was considered. Out-of-plane electric fields $E_1$ and $E_2$ were applied to the left and right regions, respectively. For simplicity, it was assumed the Zeeman field h=0 hereafter. The robust helical edge states (which cross from the conduction band to the valence band in the QSH phase as $E_i < E_c$) may or may not be present depending on the strength of the fields.

The case, $0 < E_c < E_1$ with $E_2 = E_1$ (see FIG. 3(b)) was considered. It was found that making $E_2$ negative but still equal to $E_1$ does not change the energy dispersion, but switches the spin configurations around the two valleys. The calculation of the conductance and spin-polarization (see Table 2 in Example 2 below) indicates that for one specific spin-polarization (for example, up-spin), intervalley scattering is still partially allowed, although with serious suppression of the total conductance. However, spin-flip scattering becomes impossible. This is in sharp contrast to the classic example of the valley filter in graphene where valley index is preserved during the scattering process due to special features of the well-known single-valley edge mode. In the proposed spin-filter the bulk transport from the coupled valley and spin degrees of freedom, instead of the edge states, is important. In other words, bulk states with non-spin-flip scattering processes are important ingredients for the high-efficiency spin-polarization in this Example.

Discussion

Figure 10:
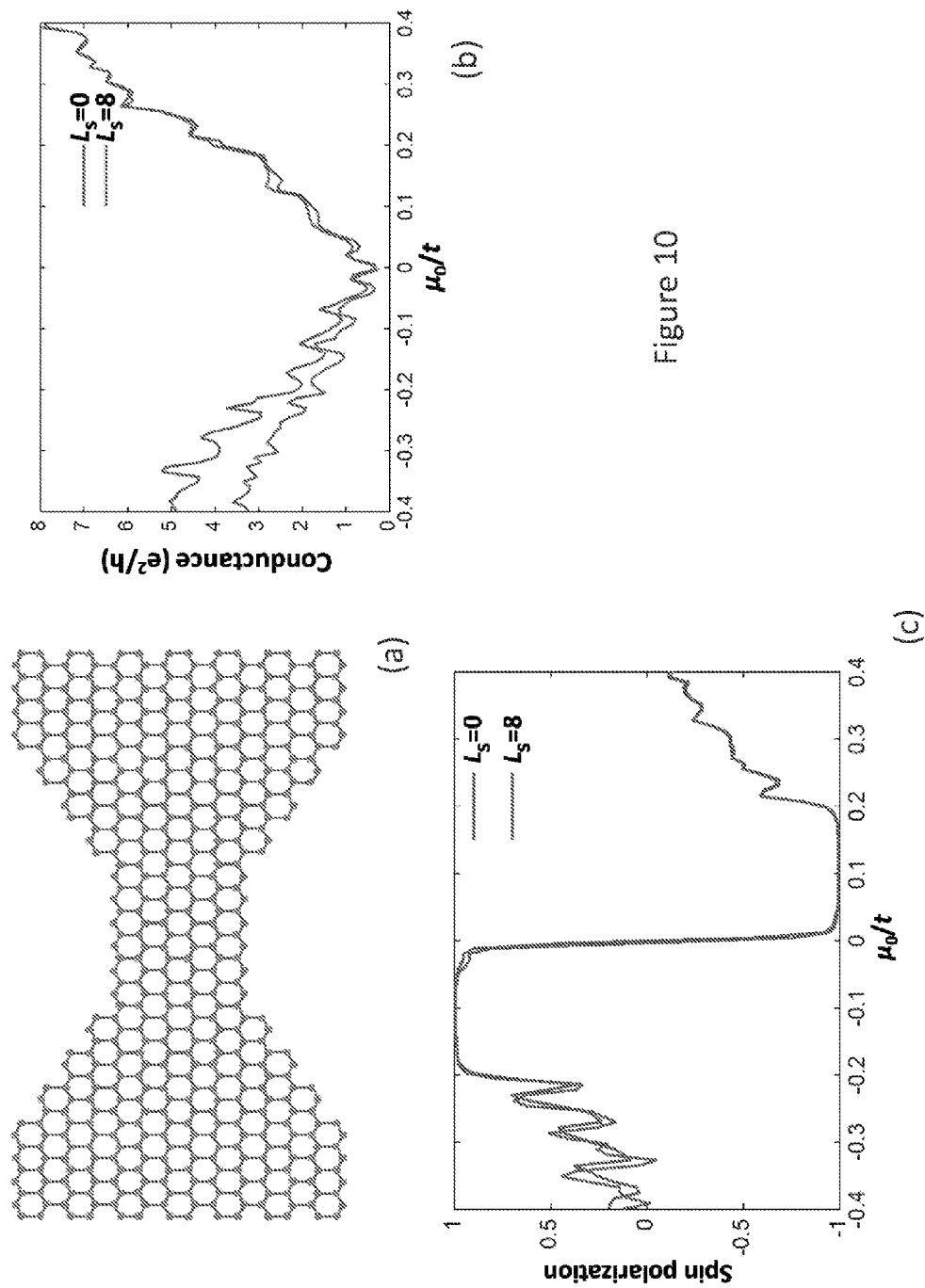
FIGS. 10(a)-10(c) illustrate spin filter with armchair edge in one embodiment: (a) shows the geometry of a spin filter with a modified structure with armchair edges for the connecting area between the wide region and the constriction; and (b) and (c) show the conductance and spin polarization, respectively.
Figure 11:
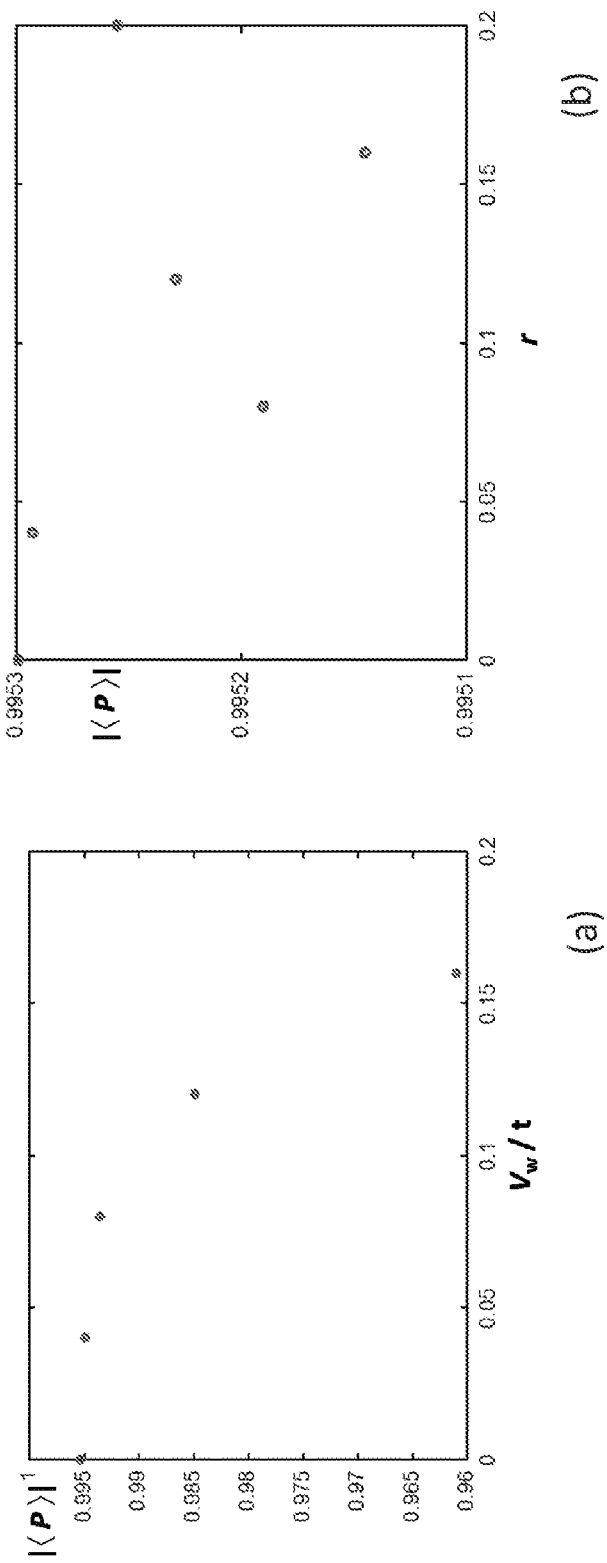
FIGS. 11(a)-11(b) illustrate robustness against weak disorder in one embodiment: (a) shows disorder-averaged spin polarization as a function of the maximum strength of the random onsite potential $V_w$; and (b) shows the disorder-averaged spin polarization as a function of the percentage of edge vacancies r in the constriction.

The high-efficiency, field-tunable spin-filter based on silicene takes advantage of charge carriers in the bulk system, small Rashba SOC, and controllable spin-splitting due to IS breaking, $\lambda v$. It was expected, therefore, that the spin-filter described herein would be robust against weak disorder (compared with $\lambda_{SO} + h$) and edge imperfections. To test this expectation, random onsite potential with a strength less than $0.1 t$ ($\sim h$) was added to the constriction. The polarization diagram was found to be almost quantitatively the same as that shown in FIG. 2(b). In particular, suppression of the polarization was found to be small, less than 2% as $|\mu_0| < 2h$. Furthermore, the connexion area of the constriction was also changed to the wide regions to be armchair-like, and random vacancies were introduced around the edge of the constriction (up to 20% of edge atoms removed). It was found that the degradation of polarization is again not severe (less than 1%) for such perturbations. See FIGS. 9-11 and the discussion provided in Example 2 below.

The working temperature of the silicene spin-filter described herein was controlled by the parameter $2\lambda_{SO} = 8.4$ meV, yielding a temperature of 97 K, which lies above the boiling point of liquid nitrogen. A similar germanene-based device with $2\lambda_{SO} = 23.6$ meV could be operated at room temperature. As to the characteristic gate voltage, a fairly large value of 1.57 VÅ$^{-1}$ for $E_z$ was used in the present simulations, corresponding to $h \approx 0.052$ eV in the narrow constriction. Such a sizable exchange field could nevertheless be induced by the magnetic proximity effect as shown in the case of graphene. Using a few times smaller value of $E_z$ with a corresponding smaller h (while maintaining the marginal VPM phase) will still keep the spin-filter functional, although the efficiency and the working region for $\mu_0$ could be moderately suppressed due to a decrease of spin-splitting in the subbands. However, such reduction in efficiency could be minimized by elongating the constriction, as indicated by the simulations of Table 3 in Example 2 below.

Figure 4:
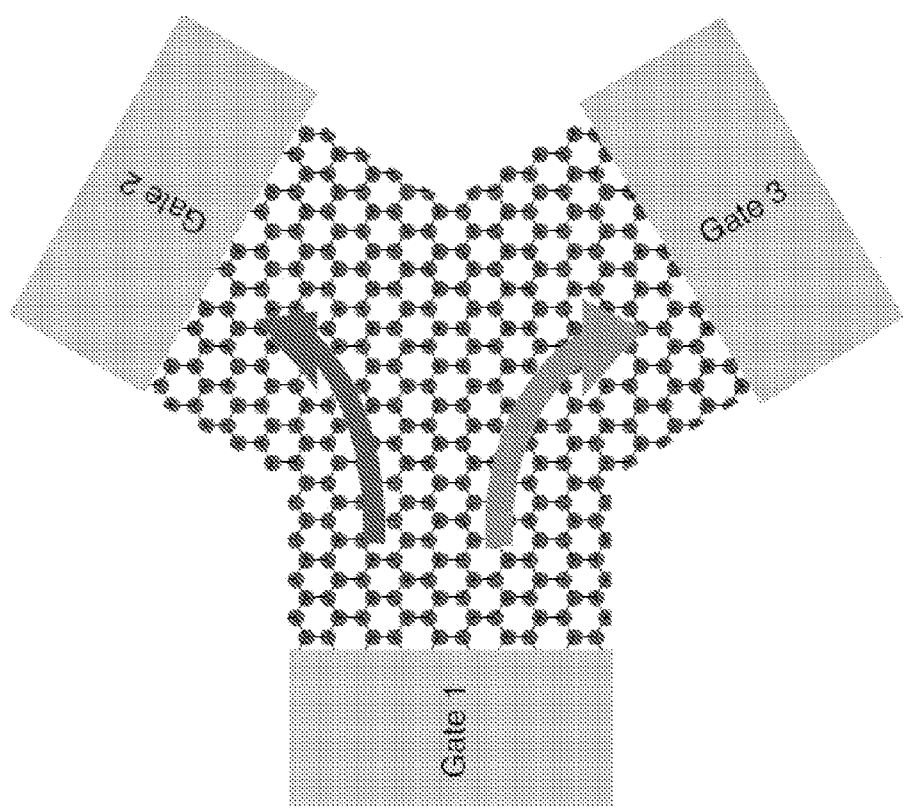
FIG. 4 illustrates a Y-shaped silicene spin-separator in one embodiment: a schematic Y-shape separator of silicene with three local gates (leads); the current separates into the gate 2 and gate 3, respectively, carrying opposite spin/valley degrees of freedom.

The spin-filter device derives its unusual transport properties via the 2D features of silicene under IS breaking and interplay between the electric and magnetic/exchange fields. To further elucidate the uniqueness of silicene and its potential for future spintronics applications, the Y-shaped spin/valley separator shown in FIG. 4 is discussed. The purpose of the device is to separate the two spin/valley polarizations from the incoming lead 1, with one running to lead 2 and the other running to lead 3.

This separator could be operated as follows: First turn on an out-of-plane electric field, $E_z > E_c$, in the central silicene sheet, tune chemical potential m into conduction bands, and then apply an in-plane electric field by setting potentials, for example, $V_1 > V_2 = V_3$, at the terminals of silicene. This set-up causes charge carriers to acquire an anomalous velocity proportional to the Berry curvature in the transverse direction, similar to that reported for graphene. By linear response theory with negligible $\lambda_R$, the Hall conductivity around valley $K\eta$ ($\eta = \pm 1$ for two valleys) with spin polarization $\sigma$ is given by $$\sigma_H^{\eta,\sigma} = \eta \frac{e^2}{2h}\left(1 - \frac{\lambda_v - \eta\sigma\lambda_{SO}}{\mu}\right). \quad (5)$$

In other words, such a set-up leads to valley and hence spin-polarization imbalance at output terminals $V_2$ and $V_3$ (with opposite polarization between them), and results in nonvanishing valley Hall $$\left(\sigma_H^{(valley)} = \frac{2e^2}{h}\left(1 - \frac{\lambda_{SO}}{\mu}\right)\right)$$

and spin Hall conductivity $$\left(\sigma_H^{(spin)} = \frac{2e^2}{h}\left(\frac{\lambda_{SO}}{\mu}\right)\right),$$

respectively. This example demonstrates that silicene (and related IVA group elements with honeycomb structures) provides a great potential host for manipulating spin/valley degrees of freedom efficiently, moving us a step closer to realizing the dream of spintronic/valleytronic applications.

Example 2

Referring to FIG. 5, the phase diagram of 2D silicene as a function of $\lambda_v$ and h. QSH: quantum spin Hall insulator. It was noted that only the phase region on the $\lambda_v$ axis is robust; for h>0, the edge states are unstable against non-magnetic disorder (QAH: quantum anomalous Hall insulator; VPM: valley polarized metal; SVPM spin valley polarized metal; BI: band insulator).

Referring to FIGS. 6(a)-6(b), to help a guide search for suitable substrates, the effect of strain on standalone silicene was illustrated by using first-principles calculations. FIG. 6(a) shows band gap size as a function of strain. FIG. 6(b) shows computed total energy as a function of strain for relaxed atomic positions. The buckling distance is determined by the relaxed atomic positions. The gap size is seen to increase as the lattice constant increases. Notably, the electronic structure of silicene remains in the quantum spin Hall phase over the range of strain considered here (±6%). It is reasonable therefore to expect that proper binding may be achieved on an appropriate substrate where the lattice mismatch is not too large.

Referring to FIGS. 7(a)-7(c), as shown in the main text, the spin filter device is basically a quantum point contact (QPC) whose geometry has a narrow region connected with two wide regions (left and right) on a silicene sheet. The wide regions (with width $L_y=70$) was kept in the SVPM phase with chosen initial incident wave at the Fermi level $E_F=t/3$, $\lambda_{SO}=0.5t$, $\lambda_R=0.075t$, $\lambda_v=0.5t$ and h=0. It was noted that realistic tight-binding parameters of silicene were not used simply for illustrative purposes. FIG. 7(a) shows the band dispersion of the constriction with $\lambda_v=0.7t$, h=0.1t in BI. The constriction is in the BI phase with both direct and indirect band gaps. The arrows indicate the direction of spin polarization. FIGS. 7(b) and 7(c) show conductance and spin polarization, respectively, for the spin filter as a function of $\mu_0$. It is noted that there exists a region where the effective chemical potential $\lambda_0$ touches only one of the valleys. Consequently, the spin polarization may reach almost 100% with finite conductance. One may easily conclude that a similar parameter setup (BI but with non-vanishing h) in the constriction area could also be a good candidate for an efficient spin filter.

Referring to FIGS. 8(a)-8(c), the same operation condition as in FIGS. 7(a)-7(c) above for the spin filter device was considered, except that the constriction region is near a critical state, where the bulk gap closes and the system is at the transition point from QSH to QAH phase via applied Zeeman field. FIG. 8(a) shows the band dispersion of the constriction with $\lambda_v=0$, h=0.52t. The arrows indicate the direction of spin polarization. FIGS. 8(b) and 8(c) show conductance and spin polarization, respectively, for the spin filter as a function of $\mu_0$. It was found that there is a dip in the conductance around zero $\lambda_0$ due to the suppression of density of states. In addition, because near low energies the conduction (valence) bands are almost polarized with spin-downs (spin-ups), the efficiency of spin polarization may reach around 50%, although with large fluctuations.

Referring to FIGS. 9(a)-9(c), the same operation condition as in FIGS. 7(a)-7(c) above for the spin filter device was considered, except that the constriction region is now in MVPM phase, which sits at the boundary between BI and VPM. FIG. 9(a) shows the band dispersion of the constriction with $\lambda_v=0.6t$, h=0.1t in MVPM phase. The arrows indicate the direction of spin polarization. FIGS. 9(b) and 9(c) show conductance and spin polarization, respectively, for the spin filter as a function of $\lambda_0$. A sharp feature in the band structure is that around each valley at low energies the electronic state is spin polarized and the conduction band bottom of one valley meets the valence band top of the other, giving rise to a zero indirect gap without any edge mode crossing between them. The spin polarization achieves nearly 100% efficiency as long as $|\mu_0|<2h=0.2t$.

Referring to FIGS. 10(a)-10(c), FIG. 10(a) shows the geometry of a spin filter with a modified structure with armchair edges for the connecting area between the wide region and the constriction. For operation conditions as in FIGS. 9(a)-9(c) above, the conductance and spin polarization are shown in FIGS. 10(b) and 10(c), respectively. Both the conductance and the spin polarization are almost unchanged compared to those in FIGS. 9(a)-9(c).

Referring to FIGS. 11(a)-11(b), FIG. 11(a) shows disorder-averaged spin polarization as a function of the maximum strength of the random onsite potential $V_w$. FIG. 11(b) shows the disorder-averaged spin polarization as a function of the percentage of edge vacancies r in the constriction. Further discussion is provided below.

Referring to Table 2, to make transport properties more transparent, a quasi-1D, zigzag-edge strip setup of silicene in which there are only two different phase domains separated by a line defect in the middle (specifically, for a given length $L_x$, the cell i<$L_x$/2 belongs to the left phase domain, while the cell i>$L_x$/2 belongs to the right one), was considered. The iterative Green's function method (as discussed in Methods below in this Example) was employed to calculate the spin-up (-down) transmission $T_\uparrow(T_\downarrow)$, conductance G, and the spin polarization $\mathcal{P}$ of the line defect in the absence of the Zeeman field. The incident wave is always set to propagate from the left domain with $\lambda_v$=0 to the right one with) $\lambda_v$=0.5t. The chemical potential of the system was adjusted to be t/3 such that the spin-degenerate, right-moving edge modes in the left domain (QSH), now representing incident waves, propagate into the right domain (SVPM). With weak dependence on $L_x$, we find that the conductance is nearly equal to 2, the number of incident channels, and the spin polarization is nearly zero. These results imply that the valley degrees of freedom are not so robust, although the incident waves have momenta closer to the right valley.

TABLE 2

Conductance and spin polarization of a line defect

| | $L_x$ (a) | | | | | |
|---|---|---|---|---|---|---|
| | 10 | 20 | 30 | 40 | 50 | 60 |
| $T_\uparrow(e^2/h)$ | 0.84041 | 0.97788 | 1.0186 | 1.0401 | 1.0425 | 1.036 |
| $T_\downarrow(e^2/h)$ | 1.0082 | 1.0095 | 0.98916 | 1.0093 | 0.99274 | 1.0019 |
| G ($e^2/h$) | 1.8486 | 1.9874 | 2.0077 | 2.0495 | 2.0353 | 2.0379 |
| P | −0.09074 | −0.01591 | 0.014661 | 0.01503 | 0.024464 | 0.016747 |

Figure 2:
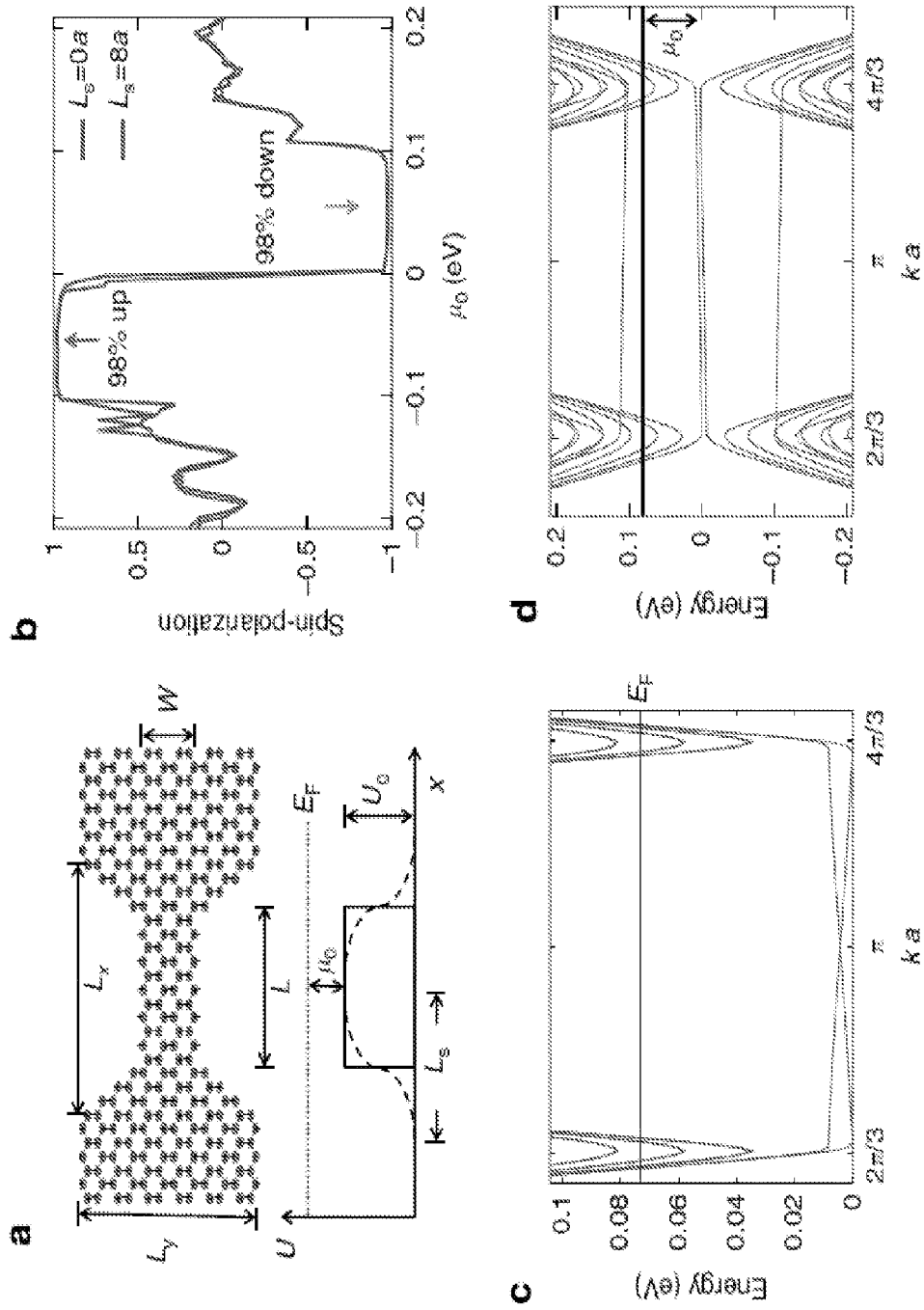
FIGS. 2($a$)-2($d$) illustrate a tunable high-efficiency spin-filter in one embodiment: (a) shows geometry of the spin-filter and the profile of the potential barrier $U(x_i)$: the two colored atoms on the lattice emphasize the buckled structure; (b) shows spin-polarization of the filter as a function of $\mu_0$ in the constriction: the blue (green) line corresponds to the case of applying potential barrier with a rectangular (smooth) shape (see text); and (c) and (d) show dispersion relations for the wide and the constriction regions, respectively.

Referring to Table 3 below, the constriction is in the marginal valley polarized metallic (MVPM) phase. Tight-binding parameters as given in Table 1 were considered realistic parameters for silicene and germanene. Various simulations reveal the consequences of decreasing external fields (while maintaining the MVPM phase) in silicene- and germanene-based spin-filter. The case as shown in FIG. 2) is highlighted. Decreasing h (and the corresponding $E_z$) while maintaining the MVPM phase, the results show that the allowed region for $\mu_0$ is narrowed down and the spin polarization P may be moderately suppressed. The reason for this could be that since the direct gap and the spin-splitting in subbands decrease with decreasing h, the relatively shorter constriction now cannot prevent the mixing of spin polarizations due to the tunneling effect. Indeed, as we make the constriction longer, spin polarization is highly improved and may reach nearly 100% again in the working region of $\mu_0$.

TABLE 3

Spin-filter efficiency under various conditions

| | $E_F$ (eV) | $E_Z$ (V/Å) | h (eV) | L (a) | $L_X$ (a) | Working region for $\mu_o$ (eV) | $P_{max}$ (%) |
|---|---|---|---|---|---|---|---|
| Silicene | 0.07302 | 1.580 | 0.0522 | 34 | 86 | ±0.1 | 98 |
| | 0.05216 | 0.387 | 0.0104 | 34 | 86 | ±0.02 | 87 |
| | 0.05216 | 0.400 | 0.0130 | 68 | 120 | ±0.025 | 99 |
| | 0.04173 | 0.387 | 0.0104 | 34 | 86 | ±0.02 | 89 |
| Germanene | 0.06778 | −0.500 | −0.0120 | 34 | 86 | ±0.025 | 86 |
| | 0.06778 | 0.463 | 0.0097 | 34 | 86 | ±0.02 | 80 |
| | 0.04842 | −0.400 | −0.0070 | 34 | 86 | ±0.01452 | 86 |
| | 0.04842 | −0.400 | −0.0070 | 68 | 120 | ±0.01452 | 98 |

Discussion

Figure 9:
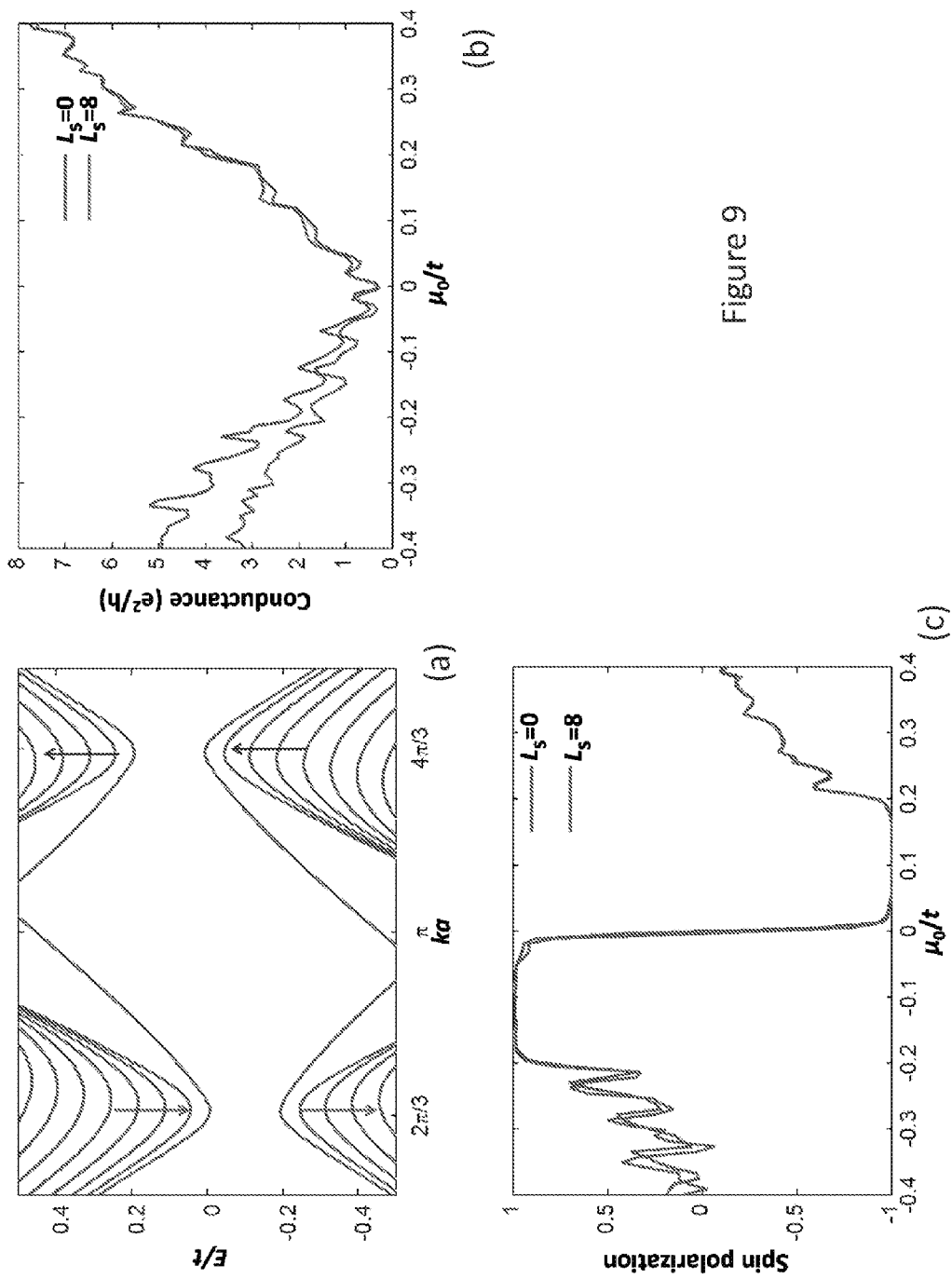
FIGS. 9(a)-9(c) illustrate spin filter with the constriction in the marginal valley polarized metallic (MVPM) phase in one embodiment: (a) shows the band dispersion of the constriction with $\lambda_v=0.6t$, $h=0.1t$ in MVPM phase; and (b) and (c) show conductance and spin polarization, respectively, for the spin filter as a function of $\mu_0$.

The effect of disorder on spin polarization under the operation condition for the spin filter as shown in FIG. 9 was considered. For the present illustrative purposes, only the following three types of disorders were considered in order to gain insight into the robustness of our proposed spin filter against weak disorder.

Case 1: Armchair Edge Replacement

The zigzag edges near the connecting area between the wide region and the constriction were replaced by armchair edges. Both the conductance and the spin polarization (See FIGS. 10(a)-10(c)) are almost unchanged from the case considered in FIGS. 9(a)-9(c). Therefore, one may expect that as long as the zigzag shape remains intact in the narrowest region, its connection with the terminals (leads) is a minor issue.

Case 2: Random Onsite Potential

Next, adding random onsite potential to the constriction region with potential strength over [0, $V_w$] was considered. Fixed values $\mu_0$=0.1t and $L_s$=0 were used in the calculations, and for each given $V_w$ 40, disorder configurations were averaged. As seen in FIG. 11(a), the deviation of the spin polarization in the clean system is quite small, e.g., it decreases less than 2% as $V_w$ increases to 0.1t. This indicates that the spin-filtering feature is very robust against such onsite disorder.

Case 3: Vacancies of Edge Atoms in the Constriction

Finally, random edge vacancies in the constriction were considered. Fixed values $\mu_0=0.1$ t and $L_s=0$ were used. Plotting spin polarization as a function of the vacancy percentage (i.e., number of vacancies out of the outermost edge atoms) in FIG. 11(c), it was observed that the spin polarization is hardly affected up to 20% vacancies, some fluctuations notwithstanding. Note that for each data point, 40 random-vacancy configurations were averaged. Thus, the (weakly) imperfect edges in the constriction still cannot destroy the large spin polarization.

In sum, the investigation of three different types of disorders considered above strongly suggests that the spin filter described in Example 1 was robust against weak disorder.

Methods

The iterative Green's function method developed by T. Ando was used to calculate the two-terminal quantum conductance and spin polarization of the silicene spin filter described in Example 1. Provided herein is description of this method, generalized for the honeycomb structure. To prepare the incoming and outgoing modes in the source and drain (wide regions), an infinitely long quasi-1D strip with finite width W along y direction (W is in units of a, a=lattice constant), zigzag edge along x direction, and the chosen unit cell with area W*a*a was considered. Each unit contains four atoms. Denoting $C_j$ as an M-component vector describing the amplitudes of the jth unit cell made of M/2(=4W) sites with spin-½ polarizations, the equation of motion for the strip may be written as $$H_0 C_j + P C_{j-1} + P^\dagger C_{j+1} = E C_j, \tag{S1}$$

where $H_0$ and P are the M×M intra-cell interaction and nearest-neighbor inter-cell interaction matrices, respectively—the full Hamiltonian is given in Eq. (1) above. E represents the Fermi level. To obtain linearly independent solutions for Eq. (S1), $$\lambda C_{j-1} = C_j, C_j = \lambda^j / C_0. \tag{S2}$$

Combining Eqs. (S1) and (S2) leads to a 2M×2M matrix equation, $$\begin{bmatrix} H_0 - E & P \\ I & 0 \end{bmatrix} \begin{bmatrix} C_j \\ C_{j-1} \end{bmatrix} = \lambda \begin{bmatrix} -P^\dagger & 0 \\ 0 & I \end{bmatrix} \begin{bmatrix} C_j \\ C_{j-1} \end{bmatrix}. \tag{S3}$$

In this eigenvalue problem, the eigenvalue $\lambda$ is related to the wave number k through $$\lambda = e^{ika}. \tag{S4}$$

The absolute value of $\lambda$ generally has three possibilities: (i)&(ii) $|\lambda|>1$ ($|\lambda|<1$), resulting in an exponentially decaying wave function along negative (positive) x direction; (iii) $|\lambda|=1$, indicating an allowed propagating mode. By varying E, one may easily map out the band structure of the quasi-1D system.

Eq. (S3) has 2M eigenvectors with corresponding 2M eigenvalues, which consist of M right- and M left-moving modes. The M right (left)-moving solutions may include traveling waves with velocity along positive (negative) x direction as well as the decaying waves with $|\lambda|$ smaller (larger) than 1. In general, any solution of Eq. (S3) may be represented by a linear combination of these eigenfunctions. Before discussing the scattering problem, some notations are defined herein.

Let $u_1(\pm), \ldots, u_M(\pm)$ be $C_0$ of the right-moving (left-moving) normalized solutions corresponding to $\lambda_1(\pm), \ldots, \lambda_M(\pm)$ and define a M×M matrix $$U(\pm) = (u_1(\pm) \ldots u_M(\pm)), \tag{S5}$$

which records the solved vectors $u_j(\pm)$. In addition, we further define a diagonal matrix $$\Lambda(\pm) = \begin{bmatrix} \lambda_1(\pm) & & \\ & \ddots & \\ & & \lambda_M(\pm) \end{bmatrix}, \tag{S6}$$

which records the solved eigenvalues $\lambda_j(\pm)$ with the relation, $\Lambda(+)\Lambda(-)=I$, and finally obtain a useful matrix $$F(\pm) = U(\pm)\Lambda(\pm)U(\pm)^{-1}. \tag{S7}$$

Described below is the scattering problem for the entire quantum point contact, consisting of a (quasi-1D) target area with length N (from cell 1 to cell N) to both sides of which an aforementioned silicene strip (source or drain) is attached. $C_0$ was taken to represent both the right- and left-going amplitude vector of the source and $C_{N+1}$ to represent the right-most one of the drain. The well-known Landauer's formula [40,41] is employed to obtain the conductance, $$G = \frac{e^2}{h} \sum_{\mu\nu} |t_{\mu\nu}|^2 = \frac{e^2}{h}(T_\uparrow + T_\downarrow)_\uparrow, \tag{S8}$$

where the valley/spin resolved transmission probability of the out-going wave is defined as $$T_{\uparrow(\downarrow)} = \Sigma_{\uparrow(\downarrow)} \Sigma_\nu |t_{\uparrow(\downarrow)\nu}|^2 \tag{S9}$$

Using this notation, the spin polarization is given by $$P = \frac{T_\uparrow - T_\downarrow}{T_\uparrow + T_\downarrow}. \tag{S10}$$

The key transmission coefficient matrix $t_{\mu\nu}$ for the incident channel $\nu$ with velocity $v_\nu$ and outgoing channel $\mu$ with velocity $v_\mu$ may be calculated through iterative Green's function method, $$t_{\mu\nu} = \left[\frac{v_\mu}{v_\nu}\right]^{1/2} \{U^{-1}(+)(N+1|G^{(N+1)}|0)P[F^{-1}(+) - F^{-1}(-)]U(+)\}_{\mu\nu}, \tag{S11}$$

where U(+), F(+), F(−) and P have been defined before. Described below is how to compute $(N+1|G^{(N+1)}|0)$. Defining the Green's functions, $(j|G^{(j)}|j)^{-1} = \langle j|(E-\mathcal{H}^{(j)})^{-1}|j\rangle$ and $(j|G^{(j)}|0)^{-1} = \langle j|(E-\mathcal{H}^{(j)})^{-1}|0\rangle$, the recursive relation for Green's functions then may be written as $$(j+1|G^{(j+1)}|j+1)^{-1} = E - \tilde{H}_{j+1} - \tilde{H}_{j+1,j}(j|G^{(j)}|j)\tilde{H}_{j,j+1}, \tag{S12}$$

$$(j+1|G^{(j+1)}|0) = (j+1|G^{(j+1)}|j+1)\tilde{H}_{j+1,j}(j|G^{(j)}|0), \tag{S13}$$

where $\tilde{H}_j$ is the intra-cell interaction matrix at the jth column cell and $\tilde{H}_{j,j+1}$ ($\tilde{H}_{j-1,j}$) is the nearest-neighbor interaction matrix from j+1th (jth) column cell to jth (j+1th) one in the region from j=0 to N; $\mathcal{H}^{(j)}$ is the total Hamiltonian including 0 to jth cell, but excluding $\tilde{H}_{j,j+1}$ and $\tilde{H}_{j+1,j}$. This recursive relation is also subject to the initial condition, $(0|G^{(O)}|0)= (E-\tilde{H}_0)^{-1}$ with $\tilde{H}_0=H_0+PF^{-1}(-)$, and the boundary condition, $\tilde{H}_{N+1}=H_{N+1}+P^\dagger F(+)$. Notice that except for the entries to various matrices defined above, all the formal derivations are, in fact, quite similar to those reported in the literature.

Additional Notes

All literature and similar material cited in this application, including, but not limited to, patents, patent applications, articles, books, treatises, and web pages, regardless of the format of such literature and similar materials, are expressly incorporated by reference in their entirety. In the event that one or more of the incorporated literature and similar materials differs from or contradicts this application, including but not limited to defined terms, term usage, described techniques, or the like, this application controls.

While the present teachings have been described in conjunction with various embodiments and examples, it is not intended that the present teachings be limited to such embodiments or examples. On the contrary, the present teachings encompass various alternatives, modifications, and equivalents, as will be appreciated by those of skill in the art.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

The above-described embodiments of the invention may be implemented in any of numerous ways. For example, some embodiments may be implemented using hardware, software or a combination thereof. When any aspect of an embodiment is implemented at least in part in software, the software code may be executed on any suitable processor or collection of processors, whether provided in a single computer or distributed among multiple computers.

In this respect, various aspects of the invention may be embodied at least in part as a computer readable storage medium (or multiple computer readable storage media) (e.g., a computer memory, one or more floppy discs, compact discs, optical discs, magnetic tapes, flash memories, circuit configurations in Field Programmable Gate Arrays or other semiconductor devices, or other tangible computer storage medium or non-transitory medium) encoded with one or more programs that, when executed on one or more computers or other processors, perform methods that implement the various embodiments of the technology discussed above. The computer readable medium or media may be transportable, such that the program or programs stored thereon may be loaded onto one or more different computers or other processors to implement various aspects of the present technology as discussed above.

The terms "program" or "software" are used herein in a generic sense to refer to any type of computer code or set of computer-executable instructions that may be employed to program a computer or other processor to implement various aspects of the present technology as discussed above. Additionally, it should be appreciated that according to one aspect of this embodiment, one or more computer programs that when executed perform methods of the present technology need not reside on a single computer or processor, but may be distributed in a modular fashion amongst a number of different computers or processors to implement various aspects of the present technology.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, the technology described herein may be embodied as a method, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one." Any ranges cited herein are inclusive.

The terms "substantially" and "about" used throughout this Specification are used to describe and account for small fluctuations. For example, they may refer to less than or equal to ±5%, such as less than or equal to ±2%, such as less than or equal to ±1%, such as less than or equal to ±0.5%, such as less than or equal to ±0.2%, such as less than or equal to ±0.1%, such as less than or equal to ±0.05%.

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" may refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") may refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The claims should not be read as limited to the described order or elements unless stated to that effect. It should be understood that various changes in form and detail may be made by one of ordinary skill in the art without departing from the spirit and scope of the appended claims. All embodiments that come within the spirit and scope of the following claims and equivalents thereto are claimed.

What is claimed:

1. A device, comprising:
a substrate; and
a layer disposed over the substrate, wherein the layer comprises at least one monolayer of crystals comprising a Group IV element or a III-V compound, wherein the crystals comprise a hexagonal lattice structure comprising atomic bonds that are buckled.

2. The device of claim 1, wherein the substrate comprises at least one of an insulator and a semiconductor.

3. The device of claim 1, wherein the Group IV element is one of Si, Ge, Sn, and Pb.

4. The device of claim 1, wherein the crystals comprise Si.

5. The device of claim 1, wherein the crystals comprise a larger spin-orbit coupling (SOC) than graphene.

6. The device of claim 1, wherein the crystals have a lattice arrangement comprising broken inversion symmetry when subjected to an external electric field.

7. The device of claim 1, wherein the device is a spin filter.

8. The device of claim 1, wherein the device is a spin separator.

9. A spintronic device, comprising:
a substrate; and
a layer disposed over the substrate, wherein the layer comprises at least one monolayer of crystals comprising at least one of Si, Ge, Sn, and Pb or a III-V compound,
wherein the spintronic device is robust against at least one of weak disorder and edge imperfections.

10. The spintronic device of claim 9, wherein the spintronic device is a spin filter configured to generate a spin-polarization level that is at least 99%.

11. The spintronic device of claim 9, wherein the spintronic device is a three-terminal spin/valley separator configured to generate spin-polarized currents with opposite spins at two output terminals of the spin/valley separator.

12. The spintronic device of claim 9, wherein the spintronic device is a part of a logical circuit configured to operate beyond binary operations.

13. A device, comprising, a substrate; and
a layer disposed over the substrate, wherein the layer comprises at least one monolayer of crystals comprising a Group IV element or a III-V compound, and wherein the layer comprises a quantum point contact (QPC).

14. The device of claim 13, wherein the substrate comprises at least one of an insulator and a semiconductor.

15. The device of claim 13, wherein the Group IV element is one of Si, Ge, Sn, and Pb.

16. The device of claim 13, wherein the crystals comprise Si.

17. The device of claim 13, wherein the crystals comprise a larger spin-orbit coupling (SOC) than graphene.

18. The device of claim 13, wherein the crystals have a lattice arrangement comprising broken inversion symmetry when subjected to an external electric field.

19. The device of claim 13, wherein the device is a spin filter.

20. The device of claim 13, wherein the device is a spin separator.

* * * * *